(12) United States Patent
Steinbach et al.

(10) Patent No.: US 7,030,711 B2
(45) Date of Patent: Apr. 18, 2006

(54) CENTERING A MULTI-BAND VOLTAGE CONTROLLED OSCILLATOR

(75) Inventors: Gunter Willy Steinbach, Palo Alto, CA (US); Thomas Allen Knotts, Mountain View, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 100 days.

(21) Appl. No.: 10/775,960

(22) Filed: Feb. 10, 2004

(65) Prior Publication Data

US 2005/0174185 A1 Aug. 11, 2005

(51) Int. Cl.
*H03B 1/00* (2006.01)
(52) U.S. Cl. ............ 331/179; 331/177 R; 331/34
(58) Field of Classification Search ............ 331/177 V, 331/179, 177 R, 34, 36 C, 117 R, 167, 117 FE
See application file for complete search history.

(56) References Cited

U.S. PATENT DOCUMENTS

| 6,133,797 | A | 10/2000 | Lovelace et al. | |
|---|---|---|---|---|
| 6,545,545 | B1 | 4/2003 | Fernandez-Texon | |
| 6,856,205 | B1 * | 2/2005 | Groe et al. ............ | 331/17 |
| 2002/0089383 | A1 | 7/2002 | Su et al. | |

FOREIGN PATENT DOCUMENTS

| EP | 0 840 447 A1 | 5/1998 |
|---|---|---|
| EP | 1 220 454 A2 | 7/2002 |

OTHER PUBLICATIONS

Dunning, Garcia, Lundberg, Nuckolls, An all-Digital Phase-Locked Loop with 50-Cycle Lock Time Suitable for High-Performace Microprocessors, IEEE Journal of Solid-State Circuits, vol. 30, No. 4, Apr. 1995, pp. 412-422.
Anand, Razavi, A 2.75 Gb/s CMOS Clock Recovery Circuit with Broad Capture Range, IEEE ISSCC 2001 Degest, p. 214.
Noguchi, Tateyama, Okamoto, Uchida, Kimura, and Takahashi, A 9.9G-10.8Gb/s Rate-Adaptive Clock and Data-Recovery with No External Reference Clock for WDM Optical Fiber Transmission, IEEE ISSCC 2002 Digest, p. 252.

* cited by examiner

*Primary Examiner*—Arnold Kinkead

(57) ABSTRACT

Centering a multi-band VCO involves comparing a VCO tuning signal to a pre-established tuning signal window to determine whether to change the frequency band of the multi-band VCO. The frequency band of the multi-band VCO can be changed only when the tuning signal is outside the tuning signal window. Further, the frequency band can be changed as long as the VCO is being controlled by a frequency detector. Once the multi-band VCO achieves lock, the multi-band VCO is changed by at least one more frequency band as long as the VCO tuning signal is still outside the tuning signal window.

14 Claims, 8 Drawing Sheets

CENTERING A MULTI-BAND VOLTAGE CONTROLLED OSCILLATOR

FIELD OF THE INVENTION

The invention relates to phase-locked loops, and more particularly, to determining the correct frequency band for centering a multi-band voltage controlled oscillator in a phase-locked loop.

BACKGROUND OF THE INVENTION

Monolithically integrated clock and data recover (CDR) circuits often use ring oscillators as voltage controlled oscillators (VCOs). Ring oscillators, especially in complimentary metal oxide semiconductor (CMOS) technology, exhibit large frequency variations with process, voltage, and temperature variations. Therefore, these VCOs need a wide tuning range even for operation at a single desired frequency. Furthermore, if a phase-locked loop (PLL) is intended to be used over a wide range of input frequencies, then even a VCO with a small amount of process variation will need a wide tuning range. Providing a wide tuning range typically requires a large tuning gain over a limited tuning voltage range. However, the larger the tuning gain, the more sensitive the VCO is to noise on the tuning signal. Sensitivity to noise can be a major problem in an integrated circuit that has several CDR channels or a large digital section in addition to the CDR.

One technique that is used to reduce the magnitude of the required tuning gain and to reduce the corresponding noise sensitivity while still providing a wide frequency range involves splitting the entire frequency tuning range of a VCO into multiple overlapping frequency bands. VCOs that are configured with multiple overlapping frequency bands are generally referred to as "multi-band VCOs." Controlling multi-band VCOs to lock onto the setpoint frequency of the VCO is a two step process. The first step involves "centering" the VCO by selecting a frequency band that includes the setpoint frequency. In most multi-band VCO implementations, the frequency bands overlap each other at their boundaries and therefore centering involves selecting the frequency band with the center frequency that is nearest to the setpoint frequency. Centering can be achieved by a digital switching mechanism that is less sensitive to noise than single-band VCOs that rely on a large tuning gain to span the entire frequency tuning range. Once the frequency of the VCO is centered near the setpoint frequency, the second step involves adjusting the analog phase-locked loop (PLL) control voltage to drive the VCO to phase and frequency lock.

Different techniques have been developed to carry out the above-identified centering function. These techniques include centering only at power-up or reset, centering with an all digital VCO control, and centering using a secondary analog control loop. Although these techniques work well, there is still a need for an improved technique for centering a multi-band VCO.

SUMMARY OF THE INVENTION

A technique for centering a multi-band VCO involves comparing a VCO tuning signal to a pre-established tuning signal window to determine whether to change the frequency band of the multi-band VCO. The frequency band of the multi-band VCO can be changed only when the tuning signal is outside the tuning signal window. Centering a multi-band VCO in response to a comparison of the VCO tuning signal to a tuning signal window enables the centering process to function on a continuous basis while the phase-locked loop is in normal operation and without having to go through a restart process.

Further, the frequency band of a VCO can be changed in the centering process as long as the VCO is being controlled by a frequency detector. Once the multi-band VCO achieves lock, the multi-band VCO is changed by at least one more frequency band as long as the VCO tuning signal is still outside the tuning signal window. Changing the multi-band VCO by at least one more frequency band after the multi-band VCO achieves lock and as long as the tuning signal is outside the tuning signal window ensures that the multi-band VCO is centered at a frequency band that will allow frequency adjustments to account for frequency drift while using a tuning signal that is within the tuning signal window.

BRIEF DESCRIPTION OF THE DRAWINGS

Throughout the description similar reference numbers are used to identify similar elements.

DETAILED DESCRIPTION

The task of a PLL is to lock the phase and frequency of a VCO signal to a particular signal, referred to herein as an input signal. PLLs with multi-band VCOs should be switched to a frequency band with a center frequency that is near the setpoint frequency of the VCO. In accordance with the invention, centering a multi-band VCO involves comparing a VCO tuning signal to a pre-established tuning signal window to determine whether or not to change the frequency band of the multi-band VCO.

Figure 1:
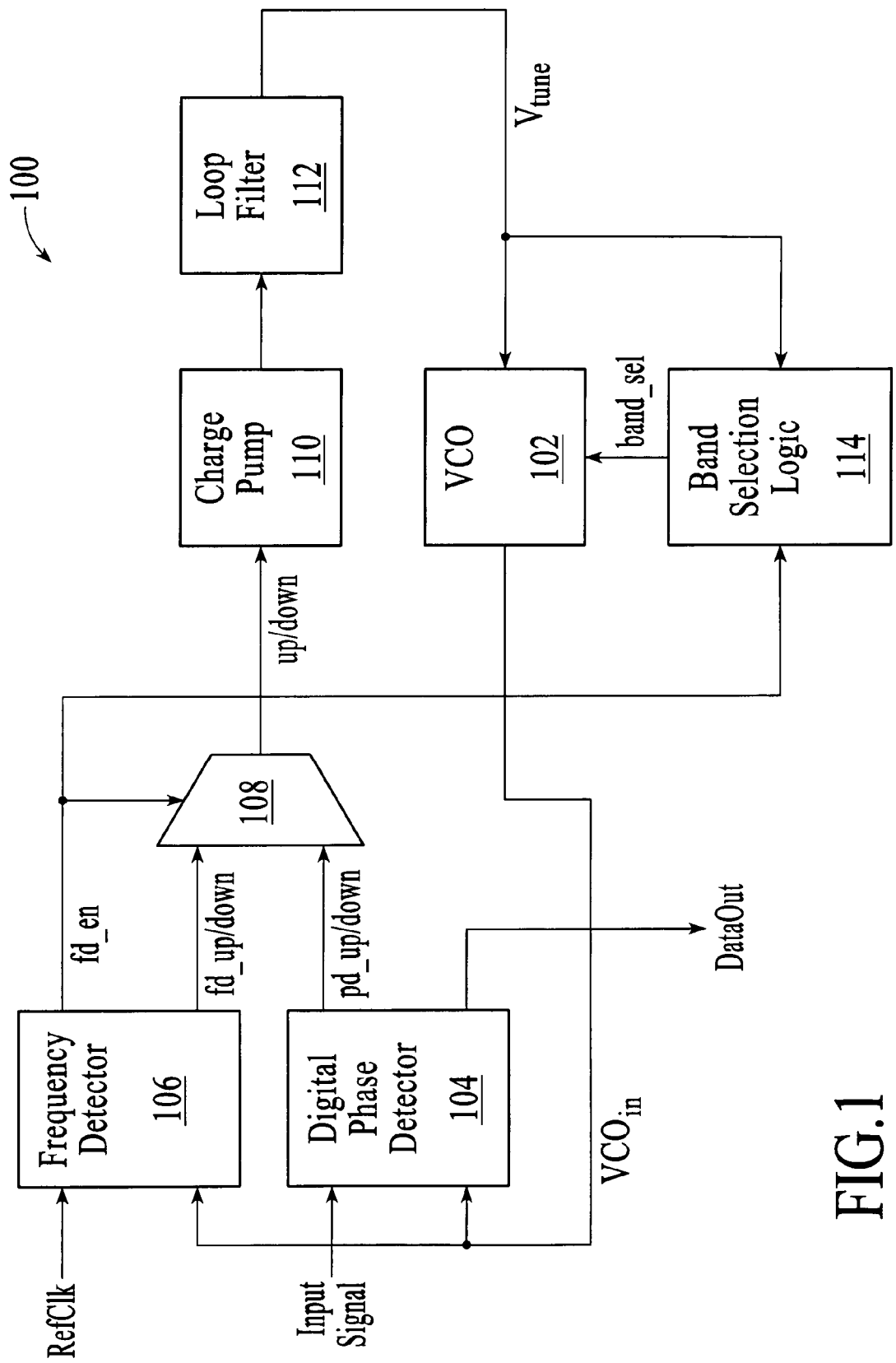
FIG. 1 depicts a PLL that includes band selection logic that is responsive to a control signal from a frequency detector and a VCO tuning signal from a loop filter.

FIG. 1 depicts an embodiment of a PLL 100 that includes a voltage controlled oscillator (VCO) 102, a digital phase detector 104, a frequency detector 106, a multiplexer 108, a charge pump 110, a loop filter 112, and band selection logic 114. The digital phase detector 104 is connected to receive an input signal from a signal source and a portion of the VCO signal ($VCO_{in}$) from the VCO. The input signal carries clock information and data that is to be recovered. As part of the PLL operation, the digital phase detector compares transitions of the input signal with transitions of the VCO signal and generates an output (referred to herein as the "pd_up/down" signal) that indicates the phase difference between the input signal and the VCO signal. The digital phase detector produces an "up" signal when the phase of the input signal leads the phase of the VCO signal and a "down" signal when the phase of the input signal lags the phase of the VCO signal. An up signal is used to drive the frequency of the VCO upward while a down signal is used to drive the frequency of the VCO signal downward, thereby advancing or retarding, respectively, the phase of the VCO signal. The digital phase detector also outputs the recovered data (DataOut). This data is not critical to the invention and is not described further.

The frequency detector 106 is connected to receive a portion of the VCO signal ($VCO_{in}$) from the VCO 102 and a reference clock signal (RefClk) from a reference clock source (often external to the system and not shown here). The frequency detector uses the reference clock signal to determine whether or not the VCO signal should be controlled by the frequency detector. The frequency detector controls the VCO when the frequency of the VCO signal is outside a pre-established deadband region that is centered at a setpoint frequency of the VCO. The frequency detector generates a control signal (referred to herein as the "fd_en" signal) that indicates whether the VCO is to be controlled by the frequency detector or the digital phase detector 104 (that is, whether control of the VCO by the frequency detector is enabled or disabled). When the frequency detector does not control the VCO because the frequency of the VCO is within the deadband region, the system is said to be in "lock." When the frequency detector does control the VCO because the frequency of the VCO is outside the deadband region, the system is said to be out of lock. The frequency detector also generates an output (referred to herein as the "fd_up/down" signal) that indicates the sign of the frequency difference between the frequency of the VCO signal and the setpoint frequency. In the embodiment of FIG. 1, when the control signal (fd_en) is high (e.g., fd_en is "high"), the output (fd_up/down) from the frequency detector controls the VCO. Conversely, when the control signal (fd_en) is low (e.g., fd_en is "low"), the output (pd_up/down) from the digital phase detector controls the VCO. The portion of the VCO signal that is received at the frequency detector and the digital phase detector may be divided by N using a signal divider (not shown). In an alternative embodiment, the function of the frequency detector can be performed by a more general "lock detector," which determines whether control of the VCO should be given up to the digital phase detector. Instead of basing the control decision on the frequency difference between the actual frequency of the VCO and a setpoint frequency (as is the case with the frequency detector), the lock detector may use other criteria, such as bit errors or consistency of phase, to determine if/when control of the VCO should be given up to the digital phase detector. Even if lock detection is not based on a frequency measurement, there is still a need for a frequency detector that generates a signal representing the sign of the frequency difference between the VCO signal and a reference signal.

The multiplexer 108 receives the control signal (fd_en) from the frequency detector 106 and allows the corresponding control signal (either fd_up/down from the frequency detector or pd_up/down from the digital phase detector 104) to control the charge pump 110. The charge pump receives an "up/down" signal from the multiplexer and transfers a positive charging current to the loop filter if the up/down signal is "up" or a negative charging current if the up/down signal is "down." The loop filter 112 generates a VCO tuning signal (referred to in the figures as $V_{tune}$) in response to an output from the charge pump. In general, when a positive charging current is received from the charge pump, the tuning voltage output from the loop filter is increased, thereby causing the frequency of the VCO 102 to increase. Conversely, when a negative charging current is received from the charge pump, the tuning voltage output from the loop filter is decreased, thereby causing the frequency of the VCO to decrease.

The band selection logic 114 is connected to receive the control signal (fd_en) from the frequency detector 106 and the VCO tuning signal ($V_{tune}$) from the loop filter 112. The band selection logic outputs a band selection signal (referred to in the figures as the "band_sel" signal) in response to the control signal (fd_en) and the VCO tuning signal ($V_{tune}$). The band selection signal determines the frequency band in which the multi-band VCO 102 is to operate. The band selection logic is described in more detail below with regard to FIGS. 2–10.

Operation of the PLL 100 depicted in FIG. 1 involves tuning the VCO 102 in response to continuous feedback from the digital phase detector 104, the frequency detector 106, and the band selection logic 114. Starting at the VCO for description purposes, the VCO receives the VCO tuning signal ($V_{tune}$) from the loop filter 112 and produces a VCO signal as an output. A portion of the VCO signal ($VCO_{in}$) is fed into the digital phase detector and the frequency detector. The digital phase detector and the frequency detector generate output signals (pd_up/down, fd_en, and fd_up/down) in response to the VCO signal ($VCO_{in}$). The output signal from one of the digital phase detector and the frequency detector selected by the multiplexer 108 in response to the control signal (fd_en) is used to continually adjust the VCO control signal ($V_{tune}$) and as a result the frequency of the VCO. Simultaneously, the band selection logic controls the frequency band in which the VCO operates in response to the control signal (fd_en) from the frequency detector and the VCO tuning signal ($V_{tune}$) from the loop filter.

Figure 2:
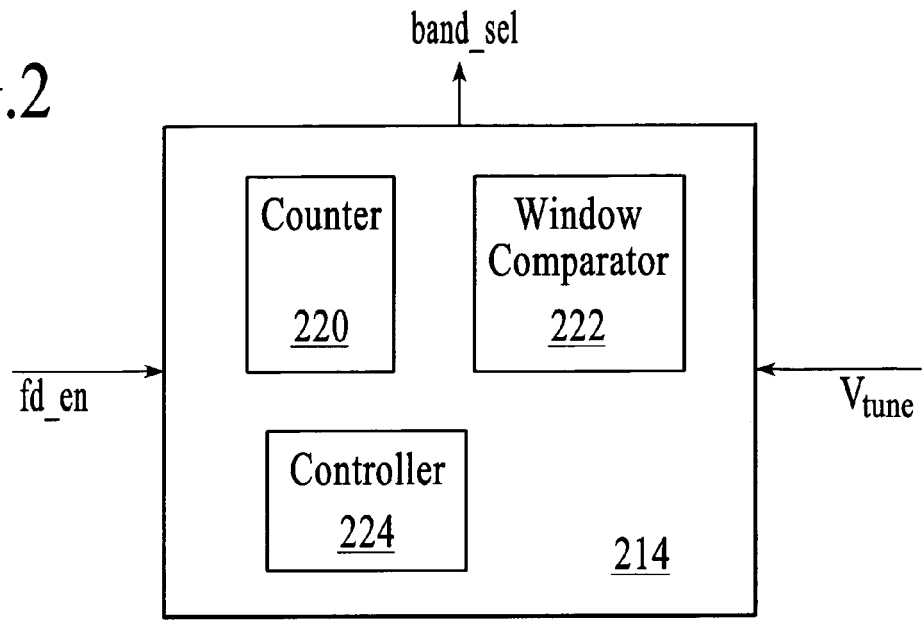
FIG. 2 depicts an expanded view of the band selection logic from FIG. 1 that includes a counter, a window comparator, and a controller.

As stated above, the invention relates to the band selection logic 214 and band selection techniques that can be implemented using the band selection logic. FIG. 2 depicts an embodiment of band selection logic that includes a counter 220, a window comparator 222, and a controller 224. The band selection logic receives the VCO tuning signal ($V_{tune}$) from the loop filter 112 (FIG. 1) and the control signal (fd_en) from the frequency detector 106 (FIG. 1) and in response outputs a band selection signal (band_sel). In the embodiment of FIG. 2, the counter is a digital counter whose counter value corresponds to a frequency band of the VCO. For example, a 3-bit binary counter can be used to individually identify (e.g., via the band_sel signal) each band of a multi-band VCO that has eight frequency bands. The counter can be a saturating up/down counter. The saturating up/down counter does not roll over when it reaches all zeroes or all ones. In accordance with an embodiment of the invention, and as will be described in greater detail below, the counter, and, hence, the band is allowed to change only when two requirements are met. The first requirement is met when the VCO tuning signal ($V_{tune}$) is outside a pre-established tuning signal window. Whether the first requirement is met is determined by the window comparator. The second requirement is met when one of two conditions is satisfied. Specifically, in accordance with the first condition, the second requirement is met when the frequency detector is controlling the VCO. For example, the second requirement is met when fd_en is high. Alternatively, in accordance with the second condition, the second requirement is met when the counter has changed by less than a predefined number, N, after the frequency detector gives up control of the VCO. For example, if N is set equal to one, then the counter is allowed to change by one (i.e., either to increase or decrease by one) after the frequency detector has given up control of the VCO provided that the first requirement is also met (i.e., the VCO tuning signal ($V_{tune}$) is outside the tuning signal window). Whether the second requirement is met is determined by the controller. In an embodiment, the counter is incremented when the VCO tuning signal ($V_{tune}$) is above an upper boundary of the tuning signal window and is decremented when the VCO tuning signal ($V_{tune}$) is below a lower boundary of the tuning signal window.

Figure 3:
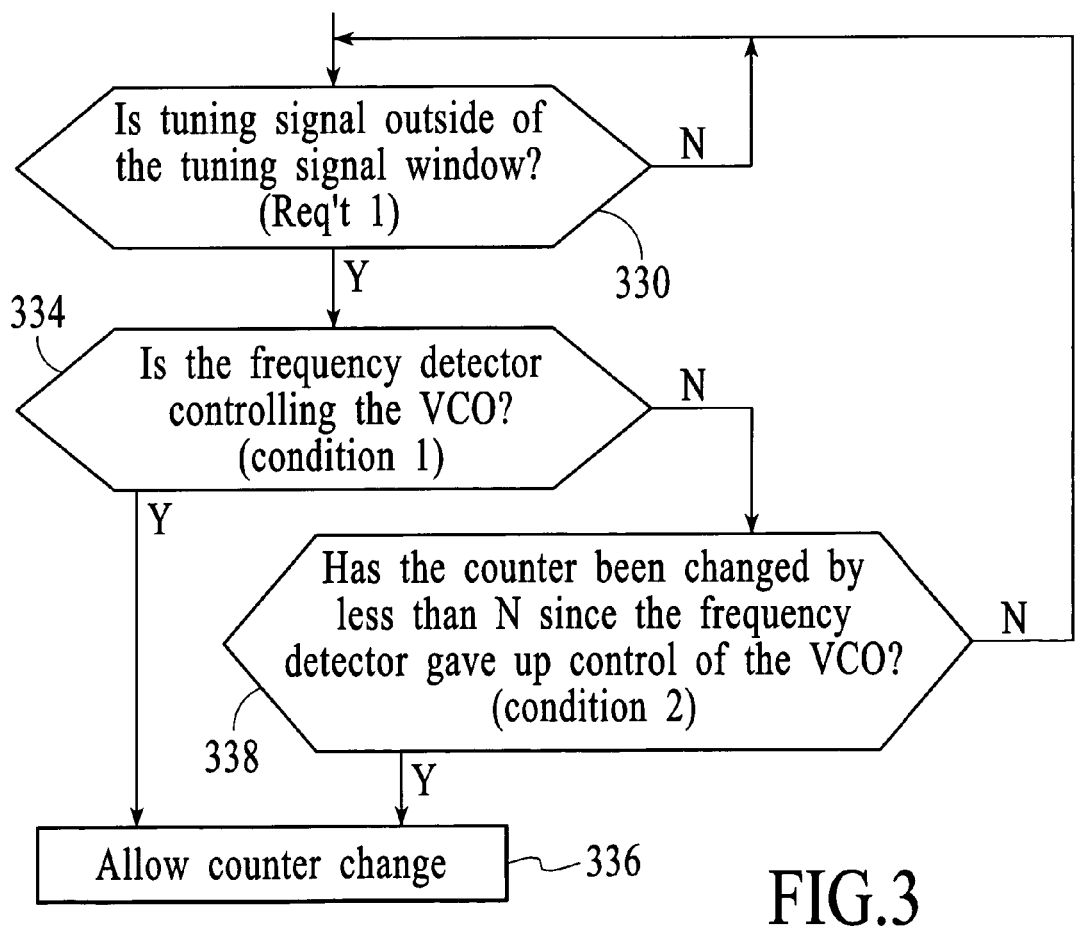
FIG. 3 depicts an example of the logic involved in determining whether or not a counter is allowed to change, thereby changing a band select signal that controls the centering of a multi-band VCO.

FIG. 3 depicts an example of the logic involved in determining whether the counter is allowed to change, thereby changing the band select signal that controls the centering of the multi-band VCO. At decision point 330, it is determined whether the VCO tuning signal ($V_{tune}$) is outside the tuning signal window. If the VCO tuning signal ($V_{tune}$) is not outside the tuning signal window, then no counter change is allowed and the process returns to the beginning. If the VCO tuning signal ($V_{tune}$) is outside the tuning signal window, then the process moves to decision point 334. At decision point 334, it is determined whether or not the frequency detector is controlling the VCO. If the frequency detector is controlling the VCO, then a counter change is allowed (either by incrementing or decrementing) as indicated by the result block 336. If, at decision point 334 it is determined that the frequency detector is not controlling the VCO, then the process moves to decision point 338. At decision point 338, it is determined whether the counter has been changed less than N times since the frequency detector gave up control of the VCO. If the answer is no "N" (the counter has been changed N or more times), then the counter cannot be changed at this time and the process returns to the beginning. If the answer is yes "Y" (the counter has been changed less than N times), then a counter change is allowed as indicated by result block 336.

Figure 4:
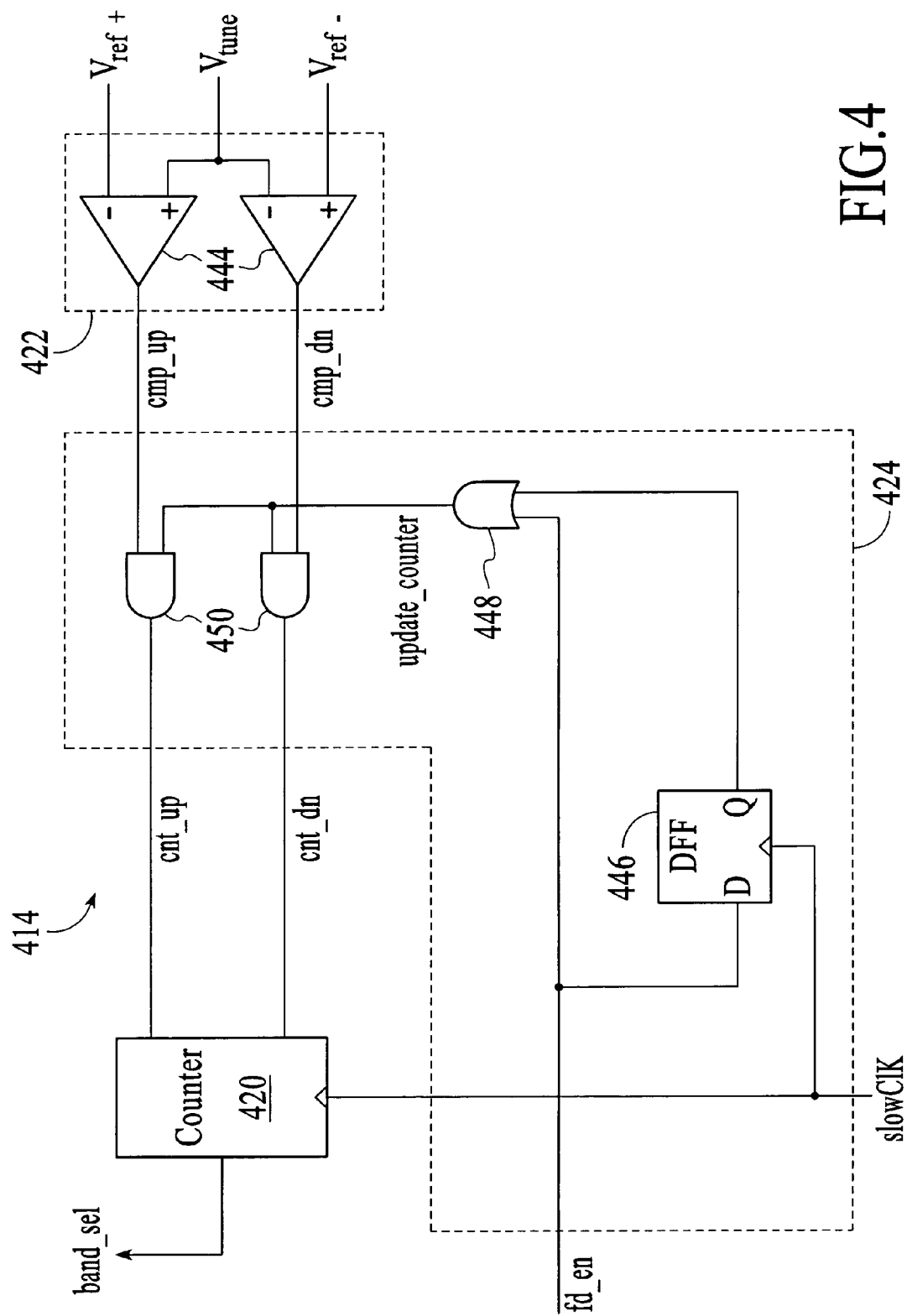
FIG. 4 depicts an embodiment of the band selection logic depicted in FIG. 2.

The functionality described with reference to FIGS. 2 and 3 can be implemented in many different ways. FIG. 4 depicts details of an embodiment of the band selection logic 214 depicted in FIG. 2. The band selection logic 414 depicted in FIG. 4 includes a counter 420, a window comparator 422, and a controller 424. The window comparator is implemented using two voltage comparators 444 with each of the two voltage comparators having an input that receives the VCO tuning voltage and an input that receives a boundary voltage. The voltage comparators compare the VCO tuning signal ($V_{tune}$) to the two voltages that make up the boundaries of the tuning voltage window and provide outputs (referred to herein as "cmp_up" and "cmp_dn") that indicate if either of the voltage boundaries have been exceeded. In the embodiment of FIG. 4, the upper voltage boundary of the tuning signal window is referred to as $V_{ref+}$ and the lower voltage boundary of the tuning signal window is referred to as $V_{ref-}$. If the VCO tuning signal ($V_{tune}$) is above $V_{ref+}$, then the comparator output cmp_up is high and the output cmp_dn is low and if the VCO tuning signal ($V_{tune}$) is below $V_{ref-}$, then the output cmp_dn is high and the output cmp_up is low. In other words, either cmp_up or cmp_dn, but not both, is high when the VCO tuning signal ($V_{tune}$) is outside the tuning signal window.

In an embodiment, boundary voltages of the tuning signal window are pre-established as a fraction of the analog tuning signal range of the VCO, such that there is enough tuning range left between either end of the tuning signal window and the ends of the analog tuning signal range to allow for the worst-case expected drift of the VCO due to temperature and supply variations as well as device aging. Assuming a constant input frequency, such VCO drift requires adjustment of the tuning signal to maintain lock. The required adjustment of the VCO tuning signal should not reach the limits of the tuning signal range or the tuning will fail and the PLL will lose lock. If the input frequency is expected to drift over time, an increased margin between the ends of the tuning signal window and the ends of the analog tuning signal range may be necessary to maintain lock without triggering a new centering cycle. As described below, a system according to the invention will recover from a drift adjustment failure by starting a new centering cycle. The magnitude of $V_{ref+}$ and $V_{ref-}$ can be set, for example, using a digital-to-analog converter (DAC) or by a resistor string.

The controller 424 is implemented using a D flip-flop (DFF) 446, an OR gate 448, and two AND gates 450. The DFF receives inputs from an external clock (referred to herein as "slowClk") and from the frequency detector (fd_en). The clock signal (slowClk) is also connected to the counter 420. The OR gate receives an input from the DFF and from the frequency detector (fd_en) and outputs a control signal (referred to herein as update_counter) if either one of the received signals is high. The DFF and the OR gate "stretch" the control signal (fd_en) from the frequency detector such that the control signal (update_counter) is high whenever the control signal (fd_en) is high and remains high for one more period of the clock signal (slowClk) after the control signal (fd_en) goes low. The resulting signal (update$_{13}$counter) from the OR gate is fed into each of the AND gates along with the results from the comparator. The AND gates gate the comparator output signals, passing the outputs of the comparator to the counter control signals (referred to herein as "cnt_up" and "cnt_dn") only if the control signal (update_counter) from the OR gate is high.

In operation, the counter 420 is incremented or decremented by one count (depending on whether cmp_up or cmp_dn is high) for each rising edge of the clock signal (slowClk) as long as the VCO tuning signal ($V_{tune}$) is outside the tuning signal window. The counter keeps its state when neither cnt_up nor cnt_dn are high. The counter also "saturates" (i.e., keeps its state instead of rolling over) when the counter is in an all ones state and cnt_up is high or when the counter is in an all zeroes state and cnt_dn is high.

Figure 5:
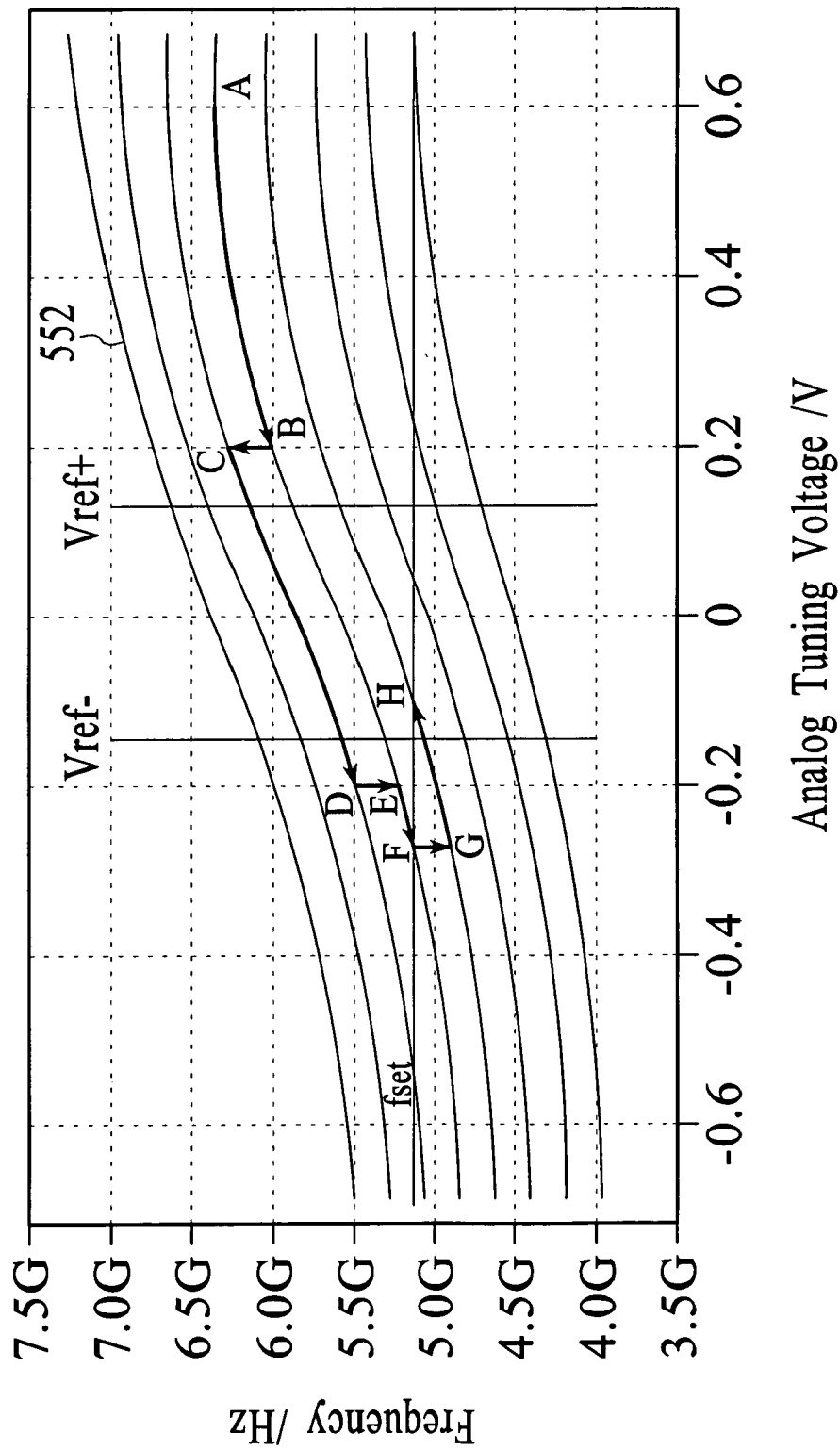
FIG. 5 depicts an exemplary VCO frequency trajectory during a VCO centering operation using the band selection logic described with reference to FIGS. 1–4.

FIG. 5 depicts an exemplary VCO frequency trajectory during a VCO centering operation using the band selection logic described with reference to FIGS. 2–4. Specifically, FIG. 5 depicts eight exemplary VCO tuning curves 552 of VCO frequency on the vertical axis and analog tuning voltage on the horizontal axis. The VCO tuning curves correspond to eight selectable frequency bands (e.g., for any analog tuning voltage on the horizontal axis there are eight possible values of the VCO frequency depending on which frequency band is selected). The two vertical lines marked $V_{ref+}$ and $V_{ref-}$ identify the voltage boundaries of the tuning signal window. The horizontal line marked "$f_{set}$" identifies the setpoint frequency of the PLL. The dark arrows identify the exemplary centering trajectory of the VCO frequency that results from the band selection logic 414 depicted in FIG. 4.

Given the band selection logic 414 described above with reference to FIG. 4, the following centering rules exist:

1. While the VCO frequency is above the setpoint frequency ($f_{set}$), the frequency detector drives the tuning voltage more negative (to the left in FIG. 5).

2. While the VCO frequency is below the setpoint frequency, the frequency detector drives the tuning voltage more positive (to the right in FIG. 5).

3. When the VCO frequency is at the setpoint frequency (or within a deadband region that is too narrow to show on the scale of FIG. 5), the frequency detector gives up control of the VCO to the digital phase detector, which then drives the VCO towards phase lock.

4. If the counter is clocked (e.g., if a positive edge of the slowClk signal arrives) while the tuning voltage is above $V_{ref+}$, then the counter is allowed to change the VCO by one frequency band to a higher frequency band.

5. If the counter is clocked while the tuning voltage is below $V_{ref-}$, then the counter is allowed to change the VCO by one frequency band to a lower frequency band.

6. If the counter is clocked while the tuning voltage is between $V_{ref+}$ and $V_{ref-}$, the counter is not allowed to change and the VCO does not change frequency bands.

7. The counter is clocked at regular time intervals. In the example of FIG. 5, the intervals are spaced such that, under control of the frequency detector, the tuning voltage changes by approximately 0.4V between clock events.

8. After the frequency detector gives up control of the VCO to the digital phase detector, the update_counter signal is allowed to go high one more time, which allows one more counter change if the VCO tuning signal is outside the tuning signal window.

9. The counter does not roll over but saturates at each end of its counting range (e.g., all zeroes or all ones).

Description of Example Centering Trajectory

The centering operation depicted in FIG. 5 is described in detail below in view of the above-described centering rules and band selection logic.

At point A, the VCO frequency is above the setpoint frequency ($f_{set}$) and therefore the VCO tuning signal is driven lower by the frequency detector, thereby driving the VCO frequency lower along path A–B.

At point B, the counter is clocked. Because the VCO tuning signal is outside the tuning signal window (greater than $V_{ref+}$) and the frequency detector is controlling the VCO, the counter is incremented by one, which causes the VCO frequency to shift up one frequency band to point C.

At point C, the VCO frequency is still above the setpoint frequency ($f_{set}$) and therefore the frequency detector drives the VCO tuning signal lower, which drives the VCO frequency lower along path C–D. Between points C and D, the counter will not change because the VCO tuning signal is within the tuning signal window. In this example, the tuning voltage is driven all the way across the tuning signal window between updates.

At point D, the counter is clocked again. Because the VCO tuning signal is outside the tuning signal window (e.g., less than $V_{ref-}$) and the frequency detector is still controlling the VCO, the counter is decremented by one, which causes the VCO to shift down by one frequency band to point E.

At point E, the VCO frequency is still above the setpoint frequency ($f_{set}$) and therefore the frequency detector drives the VCO tuning signal lower, which drives the VCO frequency lower along path E–F.

At point F, the PLL achieves frequency lock and the frequency detector gives up control of the VCO to the digital phase detector. When the counter is clocked again, because the VCO tuning signal is still outside the tuning signal window (less than $V_{ref-}$) and the update_counter signal remains high, the counter is decremented one more time (e.g., by one count) even though the frequency detector no longer controls the VCO. The counter change causes the VCO frequency to shift down by one frequency band to point G.

At point G, the shift in frequency bands causes the PLL to lose lock and control of the VCO reverts to the frequency detector. Because the VCO frequency is below the setpoint frequency ($f_{set}$), the frequency detector drives VCO tuning signal higher, which drives the VCO frequency higher along path G–H.

At point H, the PLL again achieves frequency lock and the frequency detector gives up control of the VCO to the digital phase detector. When the counter is clocked again, the update_counter signal remains high but because the VCO tuning signal is within the tuning signal window, the counter is not allowed to change. Further clock edges have no effect on the counter because the update_counter signal remains low as long as the PLL is in lock.

As can be seen through the example centering trajectory of FIG. 5, the first time the digital phase detector acquires lock at the setpoint frequency (e.g., at point F), the VCO tuning signal ($V_{tune}$) is outside the tuning signal window (less than $V_{ref-}$) and the counter is allowed to change one more time (e.g., by one count) at the next clock event. The additional count change throws the PLL out of lock. Once out of lock, the frequency detector regains control of the VCO and drives the PLL to a new lock point inside the tuning signal window (e.g., at point H). With the VCO tuning signal within the tuning signal window, the counter is prevented from reacting to clock events and the PLL stays in this stable point.

The additional counter change after the initial phase lock acquisition is crucial to finding a stable point inside the tuning signal window. Selecting a frequency band using the above-described technique allows a margin of error to account for frequency drift that may occur during operation. If the supply voltage or the operating temperature change after the end of the centering sequence, the VCO tuning curves may shift up or down as well as change shape to some degree and the PLL will change the tuning voltage ($V_{tune}$) in order to maintain phase lock. The resulting frequency drift may move the tuning voltage out of the tuning signal window but will not cause re-centering since the frequency detector will not regain control during gradual changes. However, if the environmental changes are so large that the VCO frequency drift causes the VCO tuning signal to limit at the extremes of the charge pump voltage, the PLL will lose lock, the frequency detector will regain control, and the centering sequence will be performed to move the PLL back towards the center of the tuning signal window. That is, the continuous nature of the band selection logic operation prevents the PLL from failing and will cause the multi-band VCO to automatically re-center if frequency drift causes the VCO tuning signal to limit out.

If at the moment when the counter is clocked, the VCO tuning signal is exactly at one of the two boundaries of the tuning signal window, the corresponding comparator may not have a well defined logic level output signal. This is referred to as being in a "metastable" state. This indeterminate state may propagate into the counter and may cause the counter state to change in a random way instead of up or down by exactly one count. In the example centering trajectory of FIG. 5, such an event would constitute a vertical jump of the trajectory to some random tuning curve. From the random tuning curve, the system finds its way back to phase lock within the tuning signal window according to the band selection logic described above with no negative consequences other than a somewhat longer time to completion of the centering sequence.

Figures 6, 7:
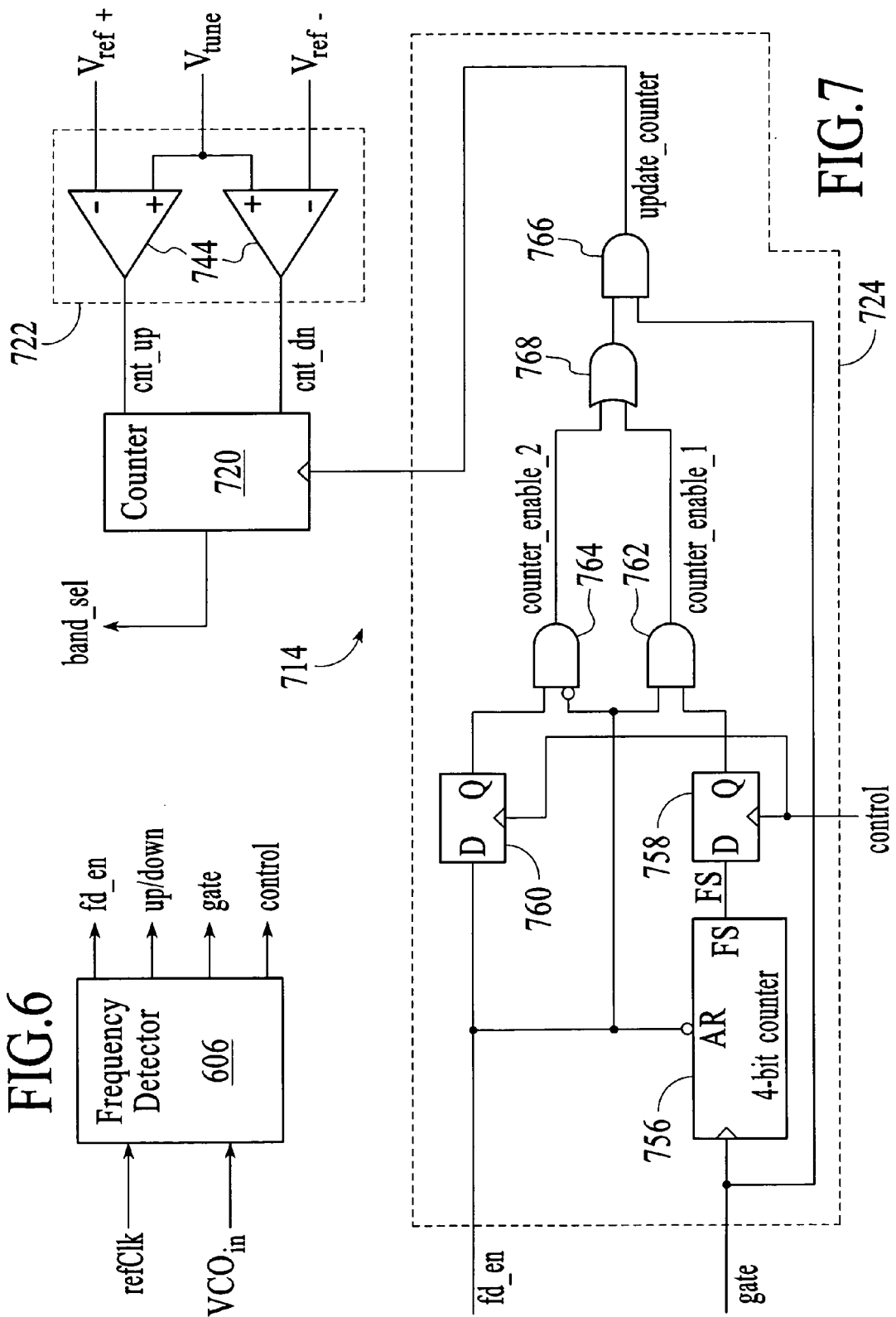
FIG. 6 depicts a frequency detector that is similar to the frequency detector of FIG. 1 except that it includes additional "gate" and "control" signals.
FIG. 7 depicts another embodiment of the band selection logic depicted in FIG. 2.

In an embodiment, the frequency detector 106 depicted in FIG. 1 includes functionality and outputs that are used by an embodiment 714 of the band selection logic 114 in the band selection process. FIG. 6 depicts a frequency detector 606 that is similar to the frequency detector of FIG. 1 except that it provides additional "gate" and "preset" signals. The gate signal is used to start and stop a counter that is internal to the frequency detector, and which is used by the frequency detector for frequency measurements. The preset signal is used to set the frequency detector's internal counter to a pre-established preset value as part of the frequency measurement process. Use of the gate and control signals by the alternative embodiment 714 of the band selection logic is described in detail below.

FIG. 7 depicts details of embodiment 714 of the band selection logic 214 depicted in FIG. 2. The band selection logic 714 of FIG. 7 includes a counter 720, a window comparator 722, and a controller 724. In the implementation of FIG. 7, the counter clock signal (update_counter) is applied directly to the counter 720 instead of to the comparator output signals (cnt_up and cnt_dn) as is the case in FIG. 4, but the result is the same. That is, the counter is only updated while the frequency detector 106 controls the VCO, and one more time after the frequency detector gives up control of the VCO. The band selection logic is configured to receive the VCO tuning signal ($V_{tune}$) from the loop filter 112 (FIG. 1) and the control signal (fd_en), the gate signal (gate), and the control signal (control) from the frequency detector. As depicted in FIG. 7, the window comparator of the band selection logic is implemented using two voltage comparators 744. Each of the voltage comparators has an input that receives the VCO tuning signal and an input for a boundary voltage. The window comparator is the same as the window comparator 422 depicted in FIG. 4 except that the outputs (cmp_up and cmp_dn) are provided directly to the counter instead of to intermediate AND gates.

The controller 724 of FIG. 7 is implemented using a controller counter 756, two flip-flops 758 and 760, three AND gates 762, 764, and 766, and an OR gate 768. The controller counter is a 4-bit counter that receives the gate signal (gate) at a normal input and the control signal (fd_en) at an inverting input. The controller counter causes an update_counter signal to be issued every sixteen gate pulses. The controller counter outputs a signal (FS) to the data input of flip-flop 758. The flip-flop 758 is connected to receive the preset signal (preset) from the frequency detector 606 (FIG. 6) and is connected to provide an output (Q) to the AND gate 762. The flip-flop 760 is connected to receive the control signal (fd_en) and the preset signal (preset) from the frequency detector. The flip-flop 760 is connected to provide an output (Q) to a normal input of the AND gate 764. AND gate 764 also receives the control signal (fd_en) from the frequency detector at an inverting input. The outputs of the AND gates 762 and 764 are provided as inputs to the OR gate 768. The output of the OR gate is provided as one of the inputs to the AND gate 766.

In operation, the controller generates one update_counter signal pulse to clock the counter 720 for every P gate pulses coming out of the frequency detector 606 (FIG. 6). Without restricting its generality, this example uses P=16 but the number P depends on the particular implementation and should be selected to give the charge pump time to slew the VCO tuning signal ($V_{tune}$) by a large fraction of the total analog tuning voltage range. The value P will depend on the charge pump slew rate, the frequency of gate pulses received from the frequency detector, and the VCO frequency band step size.

Figure 8:
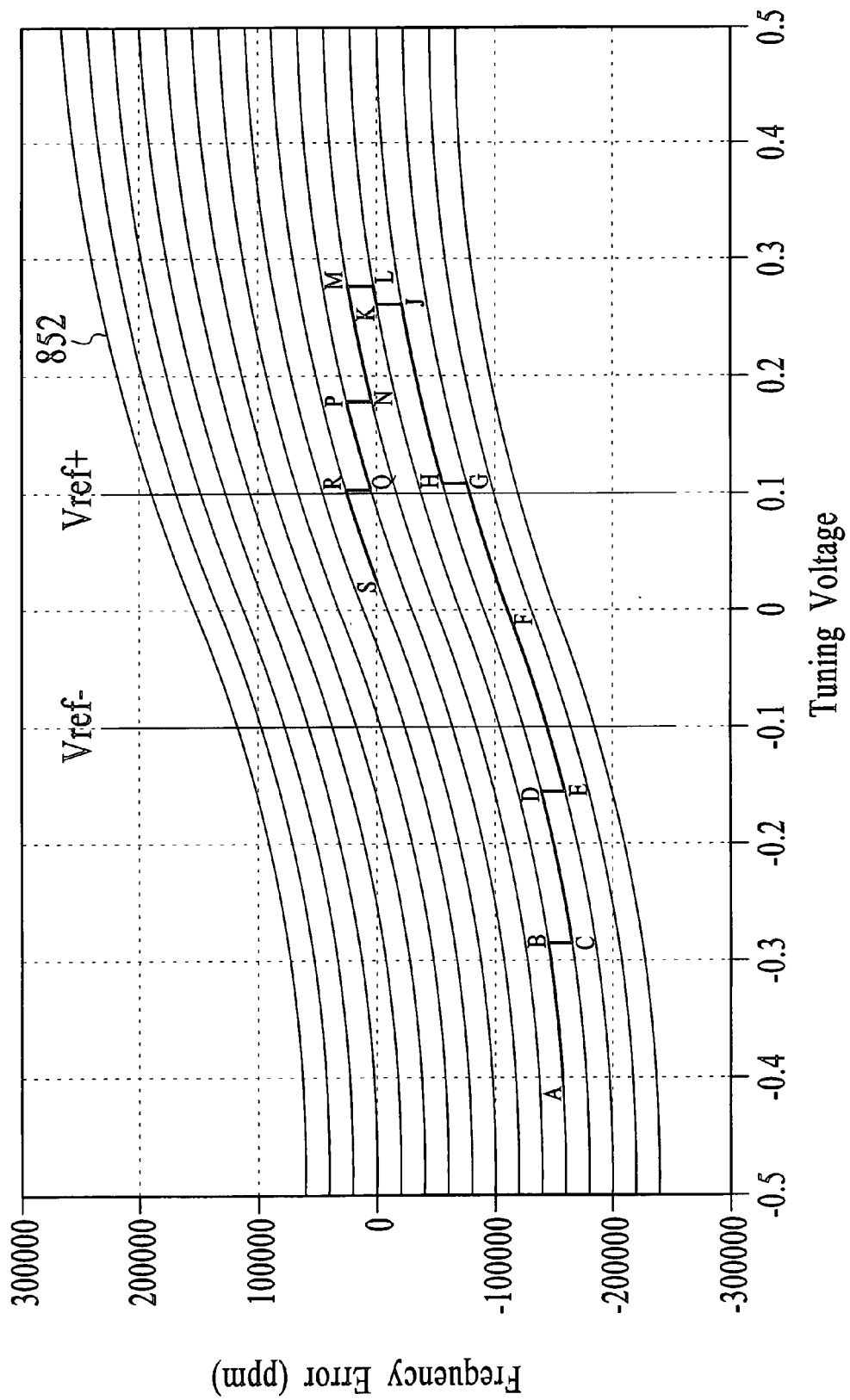
FIG. 8 depicts an exemplary VCO frequency trajectory during a VCO centering operation using the band selection logic described with reference to FIGS. 1, 3, 6, and 7.

FIG. 8 shows an exemplary centering trajectory that results from the band selection logic of FIG. 7. The exemplary centering trajectory is depicted on a graph of sixteen tuning curves 852 plotted with the tuning signal voltage ($V_{tune}$) on the horizontal axis and the normalized frequency error (e.g., the difference between the VCO frequency and data frequency in parts per million (ppm)) on the vertical axis. In this example, the frequency detector is set for a deadband region of ±2,000 ppm (with the setpoint frequency being at zero frequency error), the comparator reference voltages $V_{ref+}$ and $V_{ref-}$ of the tuning signal window are set at ±100 mV, and the multi-band VCO has sixteen frequency bands that are centered around the respective sixteen tuning curves.

The exemplary centering operation begins at point A. Since the frequency error is more than −2,000 ppm, the signals (fd_en and up/down) are high and the frequency detector increases the tuning voltage and the VCO frequency increases along path A–B. When the frequency detector completes sixteen measurements (i.e., after sixteen gate pulses), the clock signal (update_counter) is produced and because ($V_{tune}$) is below $V_{ref-}$, the counter is decreased by one count and the VCO frequency steps down one frequency band to point C.

The frequency detector continues increasing the VCO frequency along path C–D until the frequency detector completes sixteen more measurements, at which point the VCO frequency steps down another frequency band to point E. From point E, the frequency detector increases the VCO frequency along path E–F. At point F, sixteen additional frequency measurements have been made, but because the tuning voltage is within the tuning signal window, the counter is not allowed to change. The frequency detector continues to increase the VCO frequency along path F–G. After sixteen more measurements, at point G, the counter is incremented by another count because the VCO tuning signal ($V_{tune}$) is now above $V_{ref+}$. The counter change causes the VCO frequency to step up one frequency band to point H. After sixteen more counts occur along path H–J, the frequency steps up another frequency band to point K. From point K, the VCO frequency slews to point L, where the frequency error falls within the ±2,000 ppm frequency detector deadband region and the frequency detector gives up control of the VCO (i.e., fd_en goes low). The frequency detector measures the frequency of the VCO and changes its control signal (fd_en) to low when the frequency error falls within the deadband region. According to the control logic depicted in FIG. 7, the change in the control signal (fd_en) causes the immediate generation of an update_counter signal pulse, which steps the VCO frequency up another frequency band to point M. By stepping up one frequency band immediately after lock is achieved rather than waiting for another sixteen gate pulses to occur, the lock time is reduced. When the control signal (fd_en) goes low, the 4-bit controller counter 756 used to generate the signal update_counter is asynchronously reset. Resetting the 4-bit counter ensures that when the control signal (fd_en) returns high at point M, a full sixteen counts pass before the next band adjustment is allowed. This resetting gives the maximum time for the VCO frequency to be pushed towards the setpoint frequency without unnecessary correction steps, further reducing lock time.

Because point M is outside the deadband region, the frequency detector retakes control of the VCO (i.e., fd_en returns to high) and since the frequency error is positive, the frequency detector slews the tuning voltage negative (e.g., to the left in FIG. 8) along path M–N. The VCO frequency decreases along path M–N until the frequency error again falls within the deadband region at point N. This happens before the frequency detector makes sixteen measurements. When the error falls within the deadband region, the control signal (fd_en) goes low, which clears the 4-bit controller counter. Clearing the 4-bit counter causes an immediate pulse of the update_counter signal, which pushes the VCO frequency up one frequency band to point P. With the frequency error still positive, the frequency detector decreases the VCO frequency along the path P–Q until the error falls within the deadband region at point Q. Because the VCO tuning voltage is still outside the tuning signal window, the VCO frequency steps up one frequency band to point R and the frequency detector reduces the VCO frequency along path R–S to point S. At point S, the frequency error again falls within the deadband region and the frequency detector gives up control of the VCO (i.e., fd_en goes low). The change in the control signal (fd_en) causes generation of another update_counter pulse. However, since the tuning voltage is now within the tuning signal window, the counter is not allowed to change and the VCO frequency remains at the current frequency band (e.g., at point S). At point S, frequency acquisition with centering has been achieved.

Figure 9:
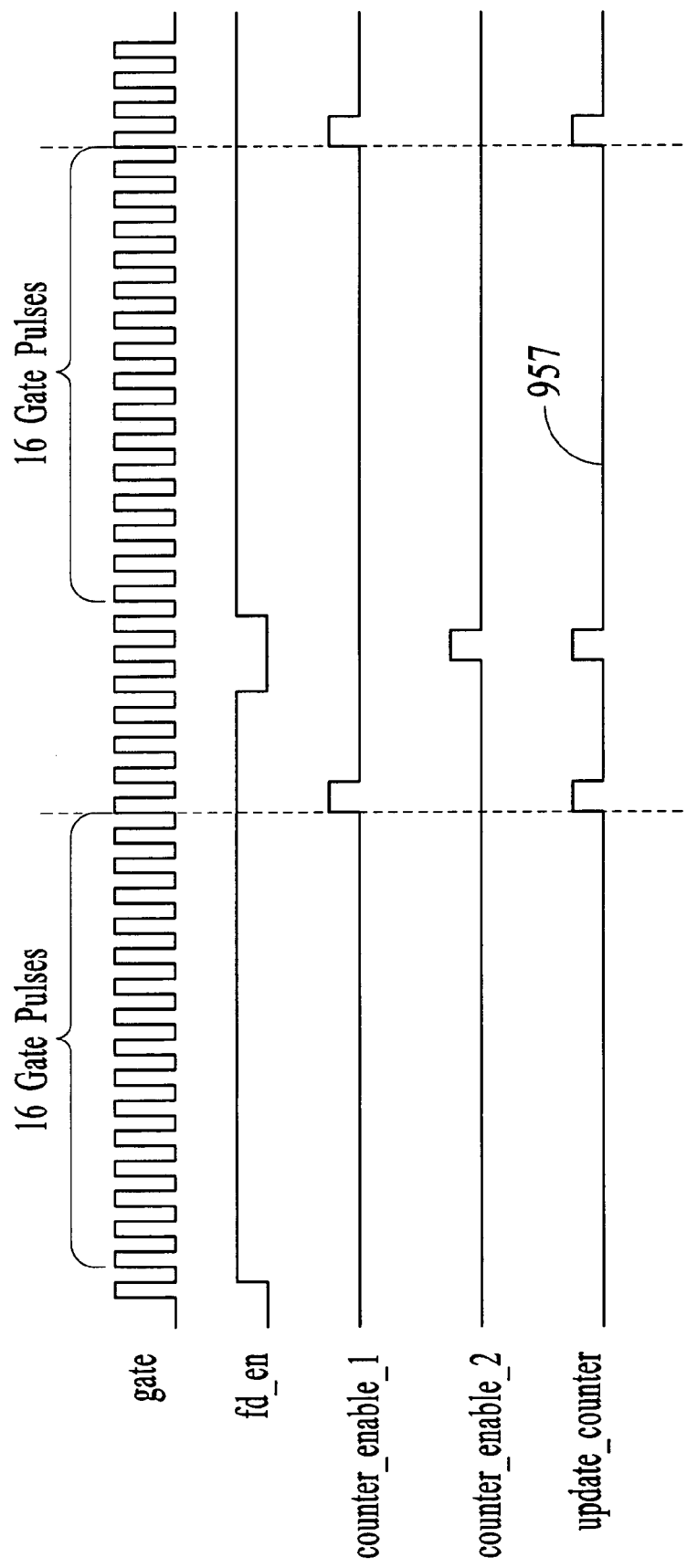
FIG. 9 depicts exemplary waveforms related to operation of the controller of FIG. 7.

FIG. 9 depicts exemplary waveforms related to operation of the controller of FIG. 7. The waveforms include the gate signal (gate), the control signal (fd_en), the counter_enable_1 signal that is output from the AND gate 762, the counter_enable_2 signal that is output from the AND gate 764, and the update_counter signal that is output from the AND gate 766. As depicted, the gate signal (gate) oscillates at a constant rate. Once the control signal (fd_en) goes high, sixteen gate pulses occur before the counter_enable_1 signal pulses high. The counter_enable_1 signal pulsing high causes the update_counter signal to pulse high. When the frequency detector gives up control of the VCO, as indicated by the control signal (fd_en) going low, the enable_counter_2 signal pulses high shortly after the change in the control signal (fd_en). The counter_enable_2 signal pulsing high causes the update_counter signal to pulse high a second time as shown by the control signal (fd_en) waveform 957. If the counter is changed by the second update_counter pulse (that is, if the VCO tuning signal is outside the tuning signal window), then the VCO is pushed out of lock and the frequency detector will re-assert control over the VCO. The frequency detector re-asserting control over the VCO is indicated by the control signal (fd_en) going high. After another sixteen gate pulses occur, the counter_enable_1 signal will pulse again.

Figure 10:
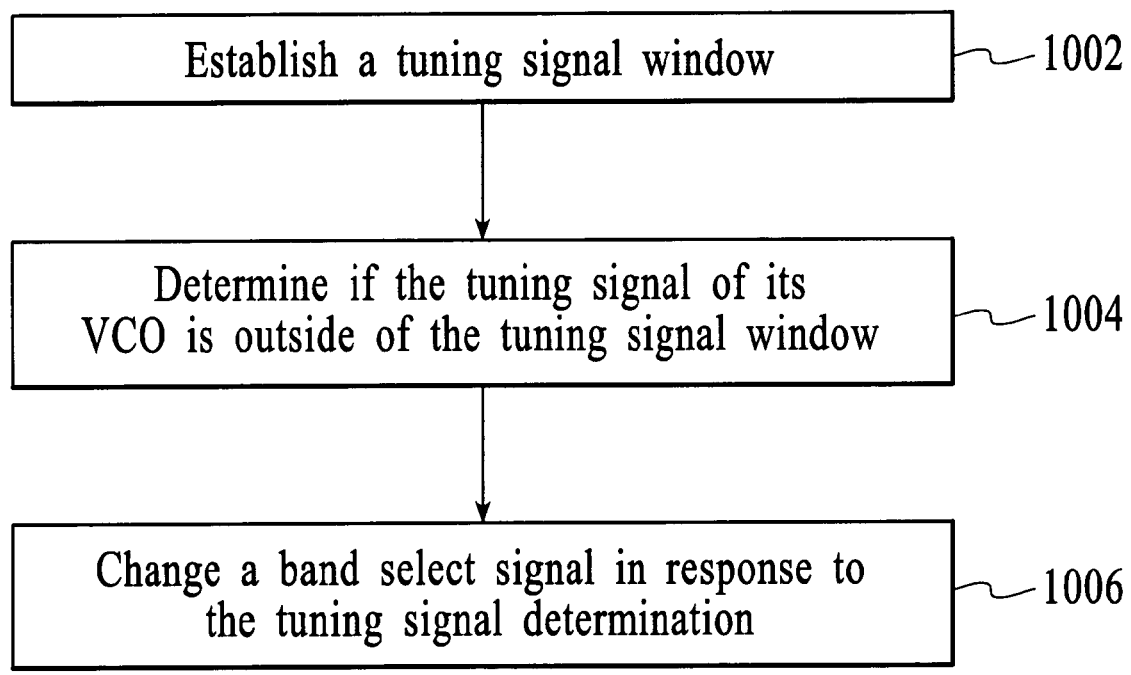
FIG. 10 is a process flow diagram of a method for centering a multi-band VCO.

FIG. 10 is a process flow diagram of a method for centering a multi-band VCO. At point 1002, a tuning signal window is established. At point 1004, it is determined if the tuning signal of its VCO is outside the tuning signal window. At point 1006, a band select signal is changed in response to the tuning signal determination.

Although the VCO tuning signal is described as a tuning voltage with regard to FIGS. 1–9, the VCO tuning signal can be some other measure such as signal current. In the case where the tuning signal is based on a change in such other measure (such as current), the window comparator would be designed to function in terms of this other measure.

Although the band selection logic is described as allowing the counter to be changed one time after the frequency detector gives up control of the VCO (i.e., N=1), the count can be allowed to change more than one time (e.g., N>1) after the frequency detector gives up control of the VCO. Allowing the counter to change more than one time can be used to achieve faster centering, especially when the VCO tuning signal is relatively far from the tuning signal window.

Additionally, although the band selection logic is described as changing the VCO frequency in single band increments, the band selection logic can be configured to change in steps of greater than one. For example, the band selection logic may incorporate dual tuning signal windows in which the outer window causes a greater number of band steps (e.g., 2 band steps) per counter update. The greater number of band steps per counter update will cause faster centering.

Although specific embodiments in accordance with the invention have been described and illustrated, the invention is not limited to the specific forms and arrangements of parts so described and illustrated. The invention is limited only by the claims.

What is claimed is:

1. A method for centering a multi-band voltage controlled oscillator (VCO) comprising:
   establishing a tuning signal window;
   determining if the tuning signal for the multi-band VCO is outside the tuning signal window; and
   changing a band select signal in response to the determining;
   wherein the band select signal is changed only when the tuning signal is determined to be outside the tuning signal window; and
   wherein changing the band select signal comprises changing the band select signal N times after lock is achieved.

2. The method of claim 1 wherein N equals 1.

3. The method of claim 1 wherein changing the band select signal includes incrementing or decrementing a count in response to the tuning signal determination and in response to whether or not the multi-band VCO is in lock.

4. The method of claim 1 wherein changing the band select signal includes incrementing or decrementing a count.

5. The method of claim 4 further including preventing said count from rolling over.

6. The method of claim 1 further including repeating the determining and the changing continuously during operation of the multi-band VCO.

7. A system for centering a multi-band voltage controlled oscillator (VCO), the system comprising:
   a counter configured to generate a band select signal for selecting a frequency band of the multi-band VCO; and
   a window comparator in signal communication with said counter, the window comparator connected to receive a tuning signal from the multi-band VCO;
   wherein the band select signal generated by said counter is changed in response to a comparison signal output by the window comparator;
   wherein the band select signal generated by the counter is changed only when the comparison signal indicates that the tuning signal is outside the tuning signal window; and
   further including a controller configured to allow the band select signal to change N times after lock is achieved.

8. The system of claim 7 wherein N equals 1.

9. The system of claim 7 wherein the controller includes logic for receiving a signal indicating the lock status and for generating an update counter signal in response to the signal.

10. The system of claim 7 additionally comprising logic for incrementing or decrementing the counter in response to the tuning signal determination and whether or not the multi-band VCO is in lock.

11. The system of claim 7 wherein said counter is a saturating counter.

12. The system of claim 7 wherein said window comparator includes two voltage comparators configured to compare the tuning signal with upper and lower voltage boundaries.

13. A system for centering a multi-band voltage controlled oscillator (VCO) comprising:
   a counter configured to generate a band select signal for selecting a frequency band of a multi-band VCO;
   a window comparator in signal communication with said counter configured to compare a tuning signal to a tuning signal window and to output a comparison signal that allows the band select signal to be changed only when the tuning signal is outside the tuning signal window; and
   a controller in signal communication with said counter configured to allow the band select signal to be changed while the multi-band VCO is controlled by a lock detector and to be changed N times after control of the multi-band VCO is given up by the lock detector.

14. The system of claim 13 wherein said window comparator includes two voltage comparators configured to compare the tuning signal with upper and lower voltage boundaries.

* * * * *